(12) United States Patent
Zhu et al.

(10) Patent No.: US 10,964,268 B2
(45) Date of Patent: Mar. 30, 2021

(54) SCAN DRIVING CIRCUIT, DRIVING METHOD, AND DISPLAY DEVICE

(71) Applicant: Shanghai Tianma AM-OLED Co., Ltd., Shanghai (CN)

(72) Inventors: Renyuan Zhu, Shanghai (CN); Yue Li, Shanghai (CN); Dongxu Xiang, Shanghai (CN); Yana Gao, Shanghai (CN); Xingyao Zhou, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 153 days.

(21) Appl. No.: 16/202,528

(22) Filed: Nov. 28, 2018

(65) Prior Publication Data
US 2019/0347996 A1    Nov. 14, 2019

(30) Foreign Application Priority Data

May 9, 2018   (CN) .......................... 201810435487.4

(51) Int. Cl.
*G11C 19/00* (2006.01)
*G09G 3/3266* (2016.01)
(Continued)

(52) U.S. Cl.
CPC ............. *G09G 3/3266* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS

| 4,623,908 A * | 11/1986 | Oshima ................. G02F 1/1368 257/66 |
| 2014/0375616 A1* | 12/2014 | Kim .................... G09G 3/3266 345/211 |

(Continued)

FOREIGN PATENT DOCUMENTS

| CN | 105243984 | * | 1/2016 |
| CN | 105243984 A | | 1/2016 |

(Continued)

OTHER PUBLICATIONS

Chinese Office Action dated May 27, 2019 for corresponding Chinese Patent Application No. 201810435487.4.

*Primary Examiner* — Tuan T Lam
(74) *Attorney, Agent, or Firm* — Tarolli, Sundheim, Covell & Tummino LLP

(57) ABSTRACT

The present disclosure provides a shift register, a driving method thereof, a scan driving circuit and a display device. The shift register includes: a first node control module configured to control level at the first node based on an input signal and a second clock signal; a second node control module configured to control level at a second node based on the input signal, the first clock signal, the second clock signal, a low level signal and a high level signal; and an output control module configured to control the output terminal to output high level or low level based on level at the first node, level at the second node and the second clock signal. The second node can be provided with a relatively low level, which is conductive to maintaining a normal output of the shift register.

17 Claims, 9 Drawing Sheets

(51) Int. Cl.
*G11C 19/28* (2006.01)
*G09G 3/36* (2006.01)
*G09G 3/20* (2006.01)

(52) U.S. Cl.
CPC ... *G11C 19/287* (2013.01); *G09G 2310/0286* (2013.01); *G09G 2310/08* (2013.01)

(56) References Cited

U.S. PATENT DOCUMENTS

| | | | |
|---|---|---|---|
| 2015/0348646 A1* | 12/2015 | Wang | G11C 19/287 377/79 |
| 2016/0180800 A1* | 6/2016 | Zheng | G09G 5/003 345/213 |
| 2016/0217870 A1* | 7/2016 | Tseng | G11C 19/28 |
| 2016/0293090 A1* | 10/2016 | Long | G09G 3/2092 |
| 2016/0295453 A1* | 10/2016 | Minamiyama | H04H 20/38 |
| 2016/0372063 A1* | 12/2016 | Li | G11C 19/28 |
| 2017/0084222 A1* | 3/2017 | Sun | G09G 3/32 |
| 2017/0256204 A1* | 9/2017 | Xiang | G09G 3/3266 |
| 2017/0287388 A1* | 10/2017 | Ma | G11C 19/28 |
| 2017/0287413 A1* | 10/2017 | Li | G09G 3/3426 |
| 2019/0311669 A1* | 10/2019 | Zhu | G09G 3/2092 |

FOREIGN PATENT DOCUMENTS

| | | | |
|---|---|---|---|
| CN | 105632444 A | | 6/2016 |
| CN | 105810142 A | | 7/2016 |
| CN | 106887204 | * | 6/2017 |
| CN | 106887204 A | | 6/2017 |

* cited by examiner

SCAN DRIVING CIRCUIT, DRIVING METHOD, AND DISPLAY DEVICE

CROSS-REFERENCE TO RELATED APPLICATIONS

The present application claims priority to Chinese Patent Application No. 201810435487.4, filed on May 9, 2018, the content of which is incorporated herein by reference in its entirety.

TECHNICAL FIELD

The present disclosure relates to display technology, and more particularly, to a scan driving circuit, a driving method of a shift register, and a display device.

BACKGROUND

With the rapid development of the flat panel display technology, an Organic Light Emitting Display (OLED for short) is more and more widely applied due to its excellent characteristics such as self-luminescence, high brightness, wide viewing angle, and rapid response.

In order to drive organic light emitting components in the OLED to emit light, an organic light emitting display panel includes a scan driving circuit, as shown in FIGS. 1 and 2. FIG. 1 is a circuit structure diagram of a shift register provided in the prior art, and FIG. 2 is an operating sequence simulation diagram of the shift register provided in the prior art. It has been found that when writing a low level to a node N2 by using a low level signal provided by a low level signal terminal VGL in phase P3, the low level is not low enough. This might easily result in that the level at the node N2 could not switch on the transistor M9, and thus leads to an error occurring in an output of the shift register.

SUMMARY

The present disclosure provides a shift register, a driving method of the shift register, a scan driving circuit, and a display device, aiming to provide a second node with a lower level, thereby facilitating maintaining a normal output of the shift register.

In a first aspect of the present disclosure, a scan driving circuit is provided. The scan driving circuit includes a plurality of cascaded shift registers. At each stage of the plurality of cascaded shift registers, a shift register includes a first node control module electrically connected to an input signal terminal, a second clock signal terminal and a first node, and configured to control a level at the first node based on an input signal and a second clock signal; a second node control module electrically connected to the input signal terminal, a first clock signal terminal, the second clock signal terminal, a low level signal terminal, a high level signal terminal and a second node, and configured to control a level at the second node based on the input signal, a first clock signal, the second clock signal, a low level signal and a high level signal, wherein a level at a third node controls writing of the first clock signal into a fourth node, the first clock signal controls writing of a level at the fourth node into the second node, and pulls down the level at the third node when the level at the fourth node changes to a low level; and an output control module electrically connected to the first node, the second node, the high level signal terminal, the second clock signal terminal and an output terminal, and configured to control the output terminal to output a high level or a low level based on the level at the first node, the level at the second node and the second clock signal.

In a second aspect of the present disclosure, a display device is provided. The display device includes the scan driving circuit according to the first aspect.

In a third aspect of the present disclosure, a driving method of a shift register of the scan driving circuit according to the first aspect. The driving method includes:

providing, by the first node control module, a low level at the first node; providing, by the second node control module, a high level at the second node, a high level at the third node and a high level at the fourth node; and controlling, by the output control module, the output terminal to output a high level, in a first phase when the input signal provided by the input signal terminal is at a low level, the first clock signal provided by the first clock signal terminal is at a low level, and the second clock signal provided by the second clock signal terminal is at a high level, maintaining, by the first node control module, the first node at the low level of the first phase; maintaining, by the second node control module, the second node at the high level of the first phase; providing, by the second node control module, a low level at the third node and a high level at the fourth node; and controlling, by the output control module, the output terminal to output a low level, in a second phase when the input signal provided by the input signal terminal is at a high level, the first clock signal provided by the first clock signal terminal is at a high level, and the second clock signal provided by the second clock signal terminal is at a low level, providing, by the first node control module, a high level at the first node; providing, by the second node control module, a low level at the second node and a low level at the fourth node; pulling down, by the second node control module, the low level of the second phase at the third node; and controlling, by the output control module, the output terminal to output a high level, in a third phase when the input signal provided by the input signal terminal is at a high level, the first clock signal provided by the first clock signal terminal is at a low level, and the second clock signal provided by the second clock signal terminal is at a high level, and maintaining, by the first node control module, the first node at the high level of the third phase; maintaining, by the second node control module, the second node at the low level of the third phase; providing, by the second node control module, a low level at the third node and a high level at the fourth node; and controlling, by the output control module, the output terminal to output a high level, in a fourth phase when the input signal provided by the input signal terminal is at a high level, the first clock signal provided by the first clock signal terminal is at a high level, and the second clock signal provided by the second clock signal terminal is at a low level.

BRIEF DESCRIPTION OF DRAWINGS

In order to illustrate technical solutions of embodiments of the present disclosure, the accompanying drawings used in the embodiments are described below. The drawings described below are a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative labor shall fall into the protection scope of the present disclosure.

Figure 1:
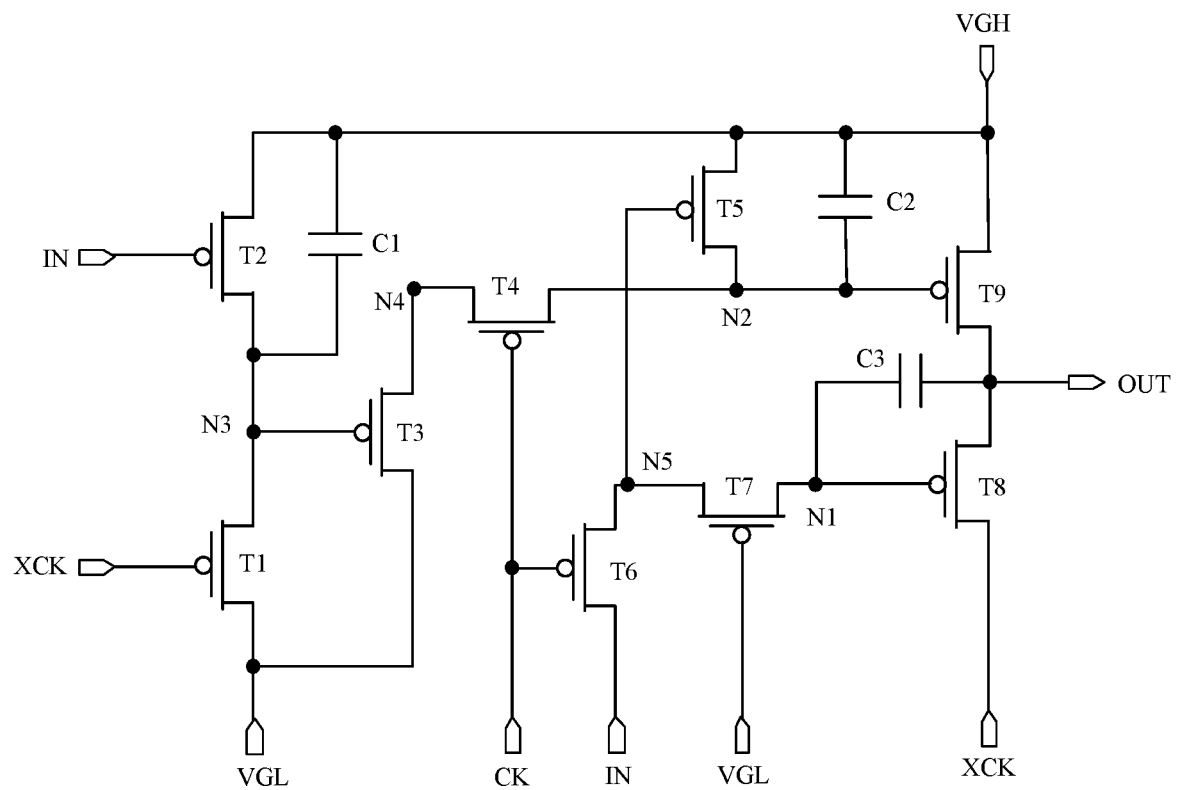
FIG. 1 is a circuit structure diagram of a shift register provided in the prior art.

A shift register provided in the prior art, as shown in FIG. 1, includes transistors T1-T9, capacitors C1-C3. The transistors and capacitors are electrically connected in a layout as shown in FIG. 1, and each of the transistors is a PMOS transistor, which is switched on when its control terminal is at a low level and switched off when its control terminal is at a high level. The transistor T7 has a control terminal electrically connected to a low level signal input terminal VGL. The transistor T7 is an always-on transistor, i.e., the transistor T7 is always switched on.

Figure 2:
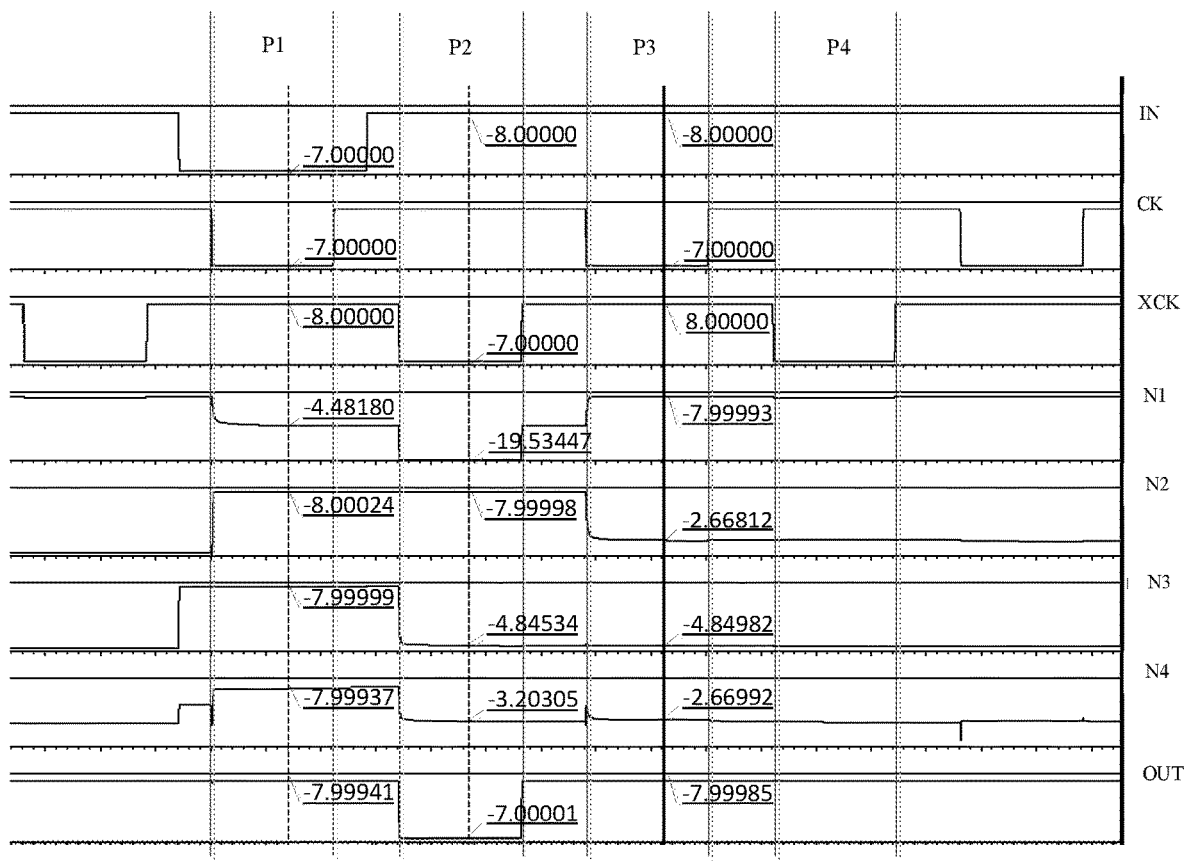
FIG. 2 is a simulation diagram of an operating sequence of the shift register provided in the prior art.

As shown in FIG. 2, an operating sequence of the shift register includes the following phases.

In phase P1, an input signal provided by an input signal terminal IN is at a low level, a first clock signal provided by a first clock signal terminal CK is at a low level, and a second clock signal provided by a second clock signal terminal XCK is at a high level. The transistor T2 controlled by the input signal is switched on. The high level signal arrives at a node N3, which is at a high level. The transistor T3 is switched off. The transistors T4 and T6 controlled by the first clock signal are switched on. A node N5 is at a low level. The transistor T5 is switched on. The high level signal arrives at a node N2, which is then at a high level. The high level at the node N2 arrives at a node N4 through the transistor T4. The node N4 is at a high level. The input signal arrives at the node N1 through the transistors T6 and T7. The node N1 is at a low level. The transistor T1 controlled by the second clock signal is switched off. The low level at the node N1 switches on the transistor T8. The high level at the node N2 switches off the transistor T9. A scan signal output terminal OUT outputs a high level of the second clock signal.

In phase P2, the input signal provided by the input signal terminal IN is at a high level, the first clock signal provided by the first clock signal terminal CK is at a high level, and the second clock signal provided by the second clock signal terminal XCK is at a low level. The transistor T2 controlled by the input signal is switched off. The transistors T4 and T6 controlled by the first clock signal are switched off. The transistor T1 controlled by the second clock signal is switched on. The low level signal arrives at the node N3, which is then at a low level. The transistor T3 is switched on. The low level signal arrives at the node N4, which is then at a low level. The capacitor C3 maintains the node N1 at the low level of phase P1. The low level at the node N1 arrives at the node N5 through the transistor T7. The node N5 is at a low level. The transistor T5 is switched on. The high level signal arrives at the node N2, which is then at a high level. The low level at the node N1 switches the transistor T8 on. The high level at the node N2 switches the transistor T9 off. The scan signal output terminal OUT outputs a low level of the second clock signal. The scan signal output terminal OUT can further pull down the low level at the node N1 under a coupling effect of the capacitor C3.

In phase P3, the input signal provided by the input signal terminal IN is at a high level, the first clock signal provided by the first clock signal terminal CK is at a low level, and the second clock signal provided by the second clock signal terminal XCK is at a high level. The transistor T2 controlled by the input signal is switched off. The transistors T4 and T6 controlled by the first clock signal are switched on. The input signal arrives at the node N5, which is then at a high level. The transistor T5 is switched off. The high level at the node N5 arrives at the node N1 through the transistor T7. The node N1 is at a high level. The transistor T1 controlled by the second clock signal is switched off. The capacitor C1 maintains the node N3 at the low level of phase P2. The transistor T3 is switched on. The low level signal arrives at the node N4 through the transistor T3. The node N4 is at a low level. The low level at the node N4 arrives at the node N1 through the transistor T4. The node N2 is at a low level. The high level at the node N1 switches the transistor T8 off. The low level at the node N1 switches the transistor T9 on. The scan signal output terminal OUT outputs a high level of the high level signal.

In phase P4, the input signal provided by the input signal terminal IN is at a high level, the first clock signal provided by the first clock signal terminal CK is at a high level, and the second clock signal provided by the second clock signal terminal XCK is at a low level. The transistor T2 controlled by the input signal is switched off. The transistors T4 and T6 controlled by the first clock signal are switched off. The transistor T1 controlled by the second clock signal is switched on. The low level signal arrives at the node N3, which is then at a low level. The transistor T3 is switched on. The low level signal arrives at the node N4, which is then at a low level. The capacitor C3 maintains the node N1 at the high level of Phase P3. The high level at the node N1 arrives at the node N5 through the transistor T7. The node N5 is at a high level. The transistor T5 is switched off. The capacitor C2 maintains the node N2 at the low level of Phase P3. The high level at the node N1 switches the transistor T8 off. The low level at the node N2 switches the transistor T9 on. The scan signal output terminal OUT outputs a high level of the high level signal.

It should be noted that during a simulation process, the input signal provided by input signal terminal IN has a high level of 8.00000V and a low level of −7.00000V, the first clock signal provided by the first clock signal terminal CK has a high level of 8.00000V and a low level of −7.00000V, the second clock signal provided by the second clock signal terminal XCK has a high level of 8.00000V and a low level of −7.00000V, the high level signal provided by high level signal terminal VGH has a high level of 8.00000V, and the low level signal provided by the low level signal terminal VGL has a low level of −7.00000V.

It has been found that during the process of writing the level at the node N2 to a low level of phase P3, since the transistors T1 and T3 are both PMOS transistors, they have threshold loss when transmitting a low level, so that the low level signal provided by the low level signal terminal VGL could not be completely transmitted to the node N2 and thus the low level at the node N2 is not low enough. Taking the high and low levels of respective signals in the above simulation process as an example, when the transistors T1 and T3 both have a threshold voltage of −2V, the low level provided to the node N2 is only −2.66812V. If the threshold voltage of the transistors T1 and T3 shifts so that the level at the node N2 rises, it is possible that the level at the node N2 could not switch the transistor M9 on, which may result in a wrong output of the shift register.

Figure 3:
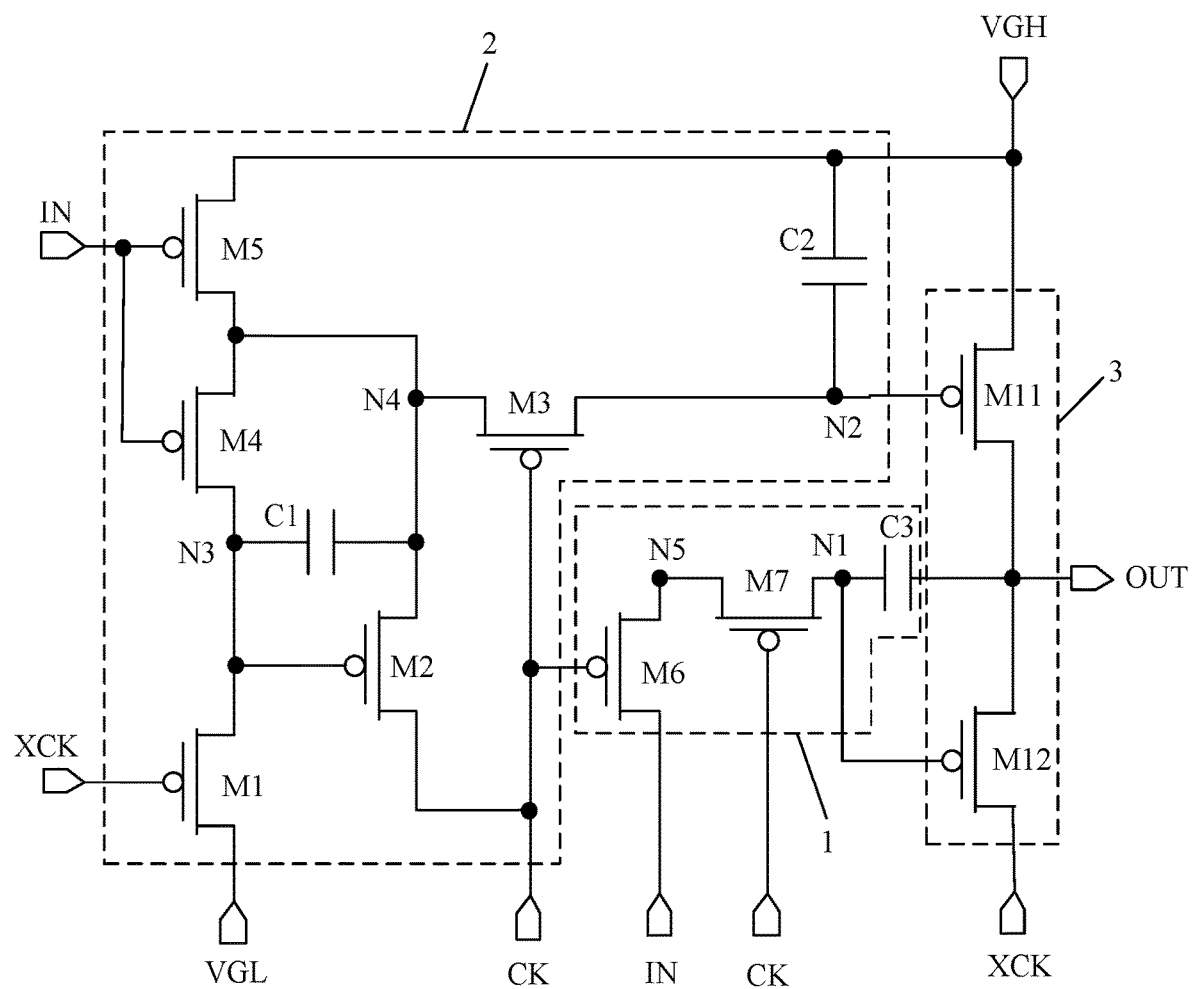
FIG. 3 is a circuit structure diagram of a shift register according to an embodiment of the present disclosure.
Figure 4:
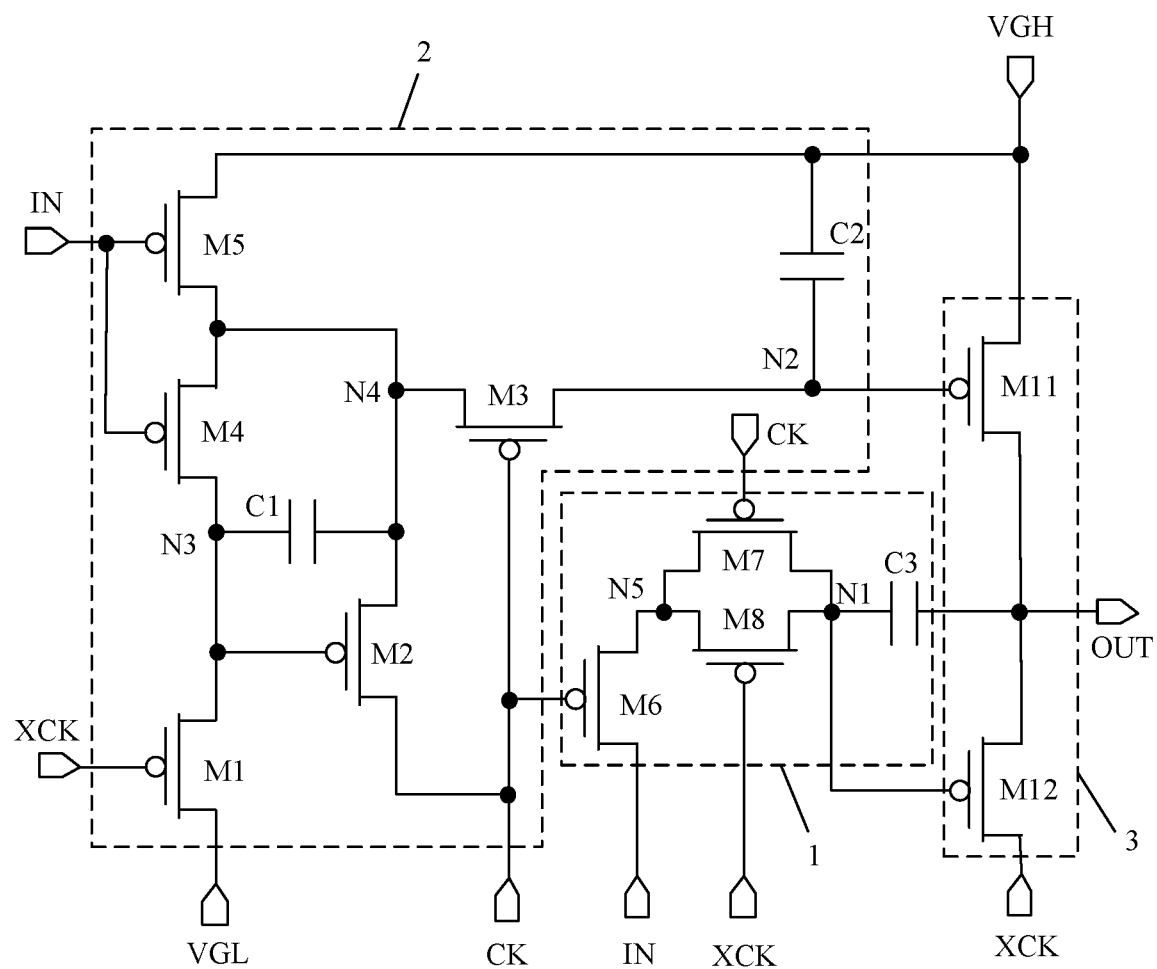
FIG. 4 is another circuit structure diagram of a shift register according to an embodiment of the present disclosure.
Figure 5:
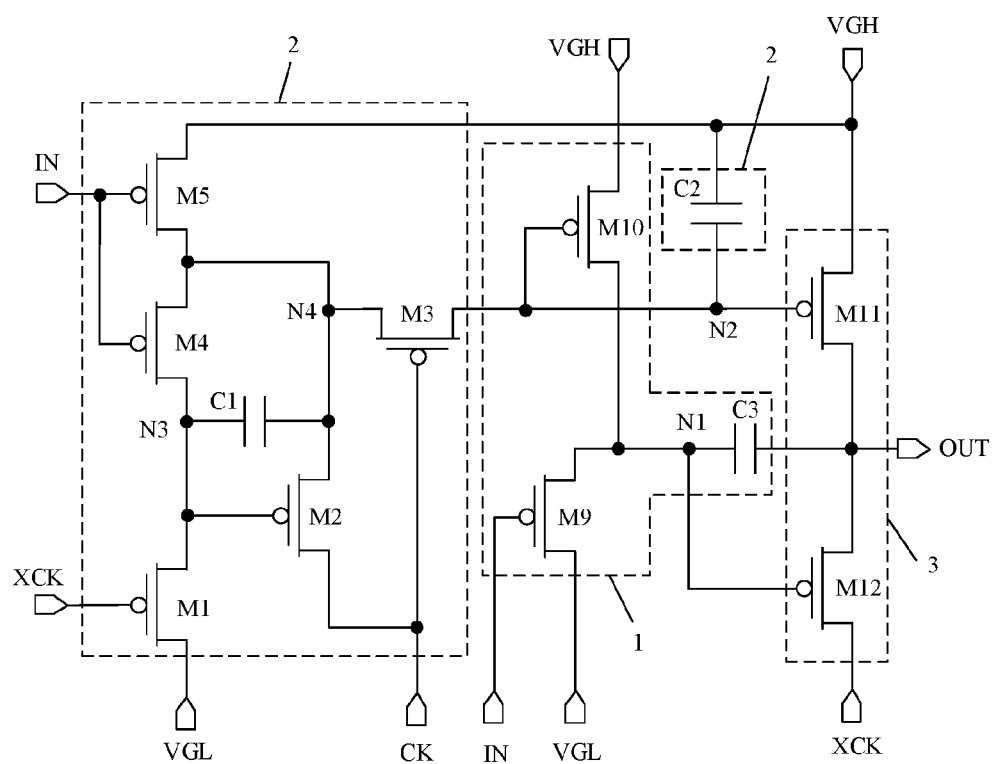
FIG. 5 is yet another circuit structure diagram of a shift register according to an embodiment of the present disclosure.
Figure 6:
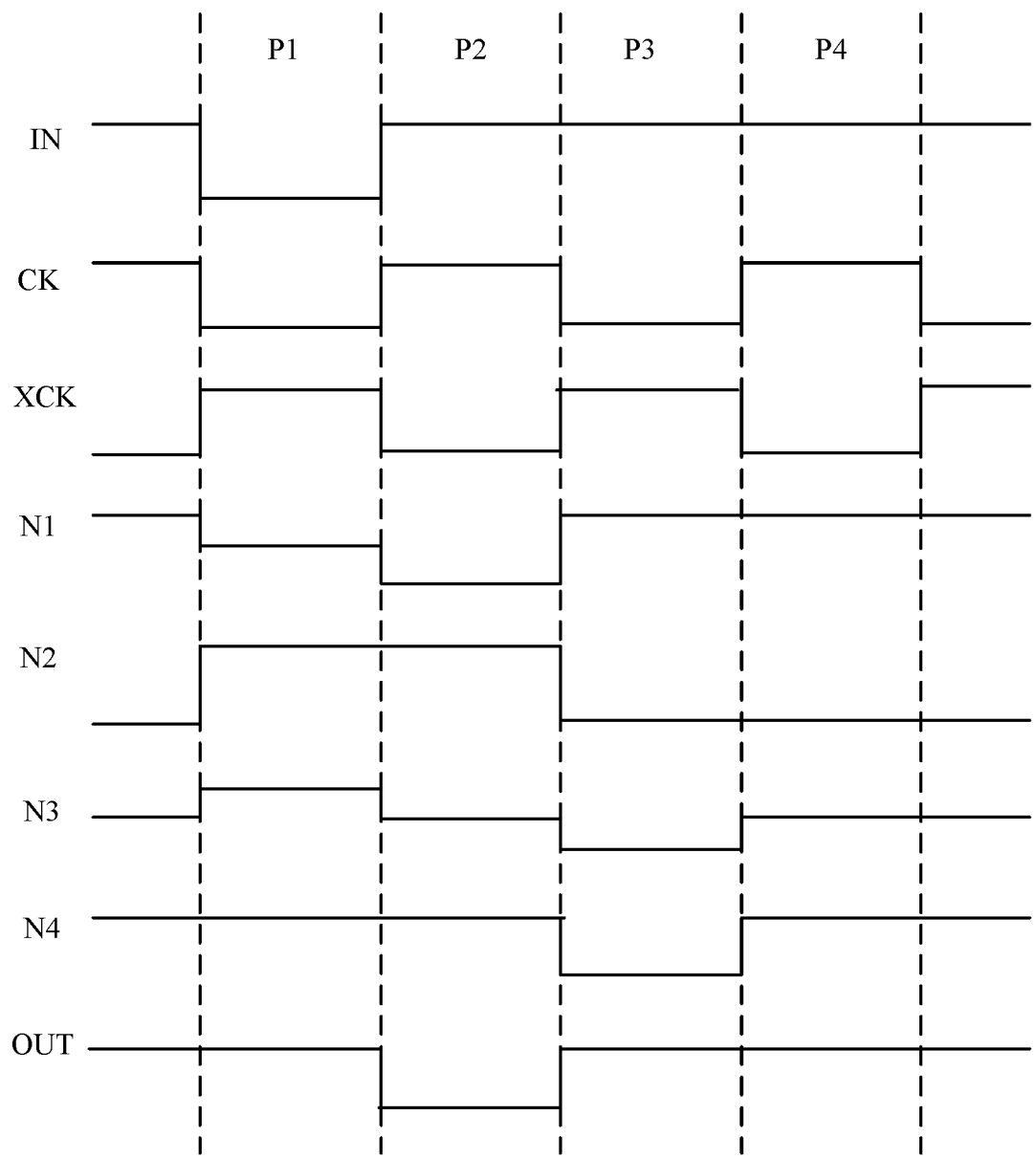
FIG. 6 is a simulation diagram of an operating sequence of a shift register according to the embodiment of the present disclosure.

In order to solve the above problems in the prior art, an embodiment of the present disclosure provides a shift register as shown in FIGS. 3-6. FIG. 3 is a circuit structure diagram of a shift register according to an embodiment of the present disclosure. FIG. 4 is another circuit structure diagram of a shift register according to an embodiment of the present disclosure. FIG. 5 is yet another circuit structure diagram of a shift register according to an embodiment of the present disclosure. FIG. 6 is a simulation diagram of an operating sequence of a shift register according to the embodiment of the present disclosure. The shift register includes a first node control module 1, a second node control module 2 and an output control module 3.

The first node control module 1 is electrically connected to an input signal terminal IN, a second clock signal terminal XCK and a first node N1, and is configured to control a level at the first node N1 based on an input signal and a second clock signal.

The second node control module 2 is electrically connected to the input signal terminal IN, a first clock signal terminal CK, the second clock signal terminal XCK, a low level signal terminal VGL, a high level signal terminal VGH and a second node N2, and is configured to control a level at a second node N2 based on the input signal, a first clock signal, a second clock signal, a low level signal and a high level signal. A level at a third node N3 controls writing of the first clock signal into a fourth node N4. The first clock signal controls writing of a level at the fourth node N4 into the second node N2. When the level at the fourth node N4 changes to a low level, the level at the third node N3 is pulled down.

The output control module 3 is electrically connected to the first node N1, the second node N2, the high level signal terminal VGH, the second clock signal terminal XCK and an output terminal OUT, and is configured to control the output terminal OUT to output a high level or a low level based on the level at the first node N1, the level at the second node N2 and the second clock signal.

Since the fact that the level at a third node N3 controls writing of the first clock signal into the fourth node N4, the first clock signal controls writing of the level at the fourth node N4 into the second node N2, the level at the third node N3 is pulled down and when the level at the fourth node N4 changes to a low level. In this way, the low level at the third node N3 in the third phase can be lower than that in the prior art. Since the low level of the first clock signal can be more completely written into the fourth node N4, the low level at the fourth node N4 can be lower, and further when the low level at the fourth node N4 is written into the second node N2, the low level at the second node N2 can be lower. Therefore, the shift register according to the embodiment of the present disclosure can provide a lower low level to the second node N2, and avoid that the level at the second node N2 could not control the output control module 3, which is conductive to a normal output of the shift register.

In an implementation, the first node control module 1 is configured to: in a first phase P1, provide a low level at the first node N1 based on the low level of the input signal, the low level of the first clock signal and the high level of the second clock signal; in a second phase P2, maintain the first node N1 at the low level of the first phase P1 based on the high level of the input signal, the high level of the first clock signal and the low level of the second clock signal; in a third phase P3, provide a high level at the first node N1 based on the high level of the input signal, the low level of the first clock signal and the high level of the second clock signal; and in a fourth phase P4, maintain the first node N1 at the high level of the third phase P3 based on based on the high level of the input signal, the high level of the first clock signal and the low level of the second clock signal.

In an implementation, the second node control module 2 is configured to: in the first phase P1, based on the low level of the input signal, the low level of the first clock signal and the high level of the second clock signal, provide a high level at the second node N2, provide a high level at the third node N3 and provide a high level at the fourth node N4; in the second phase P2, based on the high level of the input signal, the high level of the first clock signal and the low level of the second clock signal, maintain the second node N2 at the high level of the first phase P1, provide a low level at the third node N3, and provide a high level at the fourth node N4; in the third phase P3, based on the high level of the input signal, the low level of the first clock signal and the high level of the second clock signal, provide a low level at the second node N2, provide a low level at the fourth node N4 and pull down the low level at the third node N3 of the second phase P2; and in the fourth phase P4, based on the high level of the input signal, the high level of the first clock signal and the low level of the second clock signal, maintain the second node N2 at the low level of the third phase P3, provide a low level at the third node N3, and provide a high level at the fourth node N4.

In an implementation, the output control module 3 is configured to: in the first phase P1, control the output terminal OUT to output a high level based on the low level at the first node N1, the high level at the second node N2 and the high level of the second clock signal; in the second phase P2, control the output terminal OUT to output a low level based on the low level at the first node N1, the high level at the second node N2 and the low level of the second clock signal; in the third phase P3, control the output terminal OUT to output a high level based on the high level at the first node N1, the low level at the second node N2 and the high level of the second clock signal; and in the fourth phase P4, control the output terminal OUT to output a high level based on the high level at the first node N1, the low level at the second node N2 and the low level of the second clock signal.

It should be noted that the high level signal terminal VGH necessarily provides a high level signal during the first phase P1 to the fourth phase P4, and the low level signal terminal VGL provide a low level signal during the first phase P1 to the fourth phase P4. In addition, the first clock signal and the second clock signal have a same frequency, there is no overlapping between their enable levels, and there may be overlapping or may be no overlapping between their non-enable levels. In the examples as shown in FIGS. 3-6, the enable levels of the first clock signal and the second clock signal both are low levels, the non-enable levels of the first clock signal and the second clock signal both are high levels, and there is no overlapping between low levels of the first clock signal and the second clock signal and between high levels of the first clock signal and the second clock signal.

To assist those skilled in the art in understanding and achieving the beneficial effects of the above-mentioned shift register, an embodiment of the present disclosure provides a driving method of the above-mentioned shift register. Referring to FIGS. 3-6, the driving method includes:

in a first phase P1 when the input signal provided by the input signal terminal IN is at a low level, the first clock signal provided by the first clock signal terminal CK is at a low level, and the second clock signal provided by the second clock signal terminal XCK is at a high level, providing, by the first node control module 1, a low level at the first node N1; providing, by the second node control module 2, a high level at the second node N2, a high level at the third node N3 and a high level at the fourth node N4; and controlling, by the output control module 3, the output terminal OUT to output a high level;

in a second phase P2 when the input signal provided by the input signal terminal IN is at a high level, the first clock signal provided by the first clock signal terminal CK is at a high level, and the second clock signal provided by the second clock signal terminal XCK is at a low level, maintaining, by the first node control module 1, the first node N1 at a low level of the first phase; maintaining, by the second node control module 2, the second node N2 at the high level of the first phase; providing, by the second node control module 2, a low level at the third node N3 and a high level at the fourth node N4; and controlling, by the output control module 3, the output terminal OUT to output a low level;

in a third phase P3 when the input signal provided by the input signal terminal IN is at a high level, the first clock signal provided by the first clock signal terminal CK is at a low level, and the second clock signal provided by the second clock signal terminal XCK is at a high level, providing, by the first node control module 1, a high level at the first node N1; providing, by the second node control module 2, a low level at the second node N2 and a low level at the fourth node N4; pulling down, by the second node control module 2, the low level at the third node N3 in the second phase; and controlling, by the output control module 3, the output terminal OUT to output a high level; and in a fourth phase P4 when the input signal provided by the input signal terminal IN is at a high level, the first clock signal provided by the first clock signal terminal CK is at a high level, and the second clock signal provided by the second clock signal terminal XCK is at a low level, maintaining, by the first node control module 1, the first node N1 at the high level of the third phase; maintaining, by the second node control module 2, the second node N2 at the low level of the third phase; providing, by the second node control module 2, a low level at the third node N3 and a high level at the fourth node N4; and controlling, by the output control module 3, the output terminal OUT to output a high level.

In an implementation, the low level of the first clock signal and the low level of the second clock signal are both equal to the low level of the low level signal, and the high level of the first clock signal and the high level of the second clock signal are both equal to the high level of the high level signal. In this way, the first clock signal and the second clock signal can be provided with a low level as well as a low level signal via a same signal line, and the first clock signal and the second clock signal can be provided with a high level as well as a low high signal via a same signal line. This can facilitate simplifying the driving method of the scan driving circuit including the above shift register and simplifying the structure of the display device.

In the following, the specific circuit structures of the first node control module 1, the second node control module 2 and the output control module 3 of the shift register will be illustrated with respect to FIGS. 3-5. It should be noted that the following descriptions are also applicable to the shift register and its driving method according to the embodiments of the present disclosure.

In an implementation, as shown in FIGS. 3-5, the second node control module 2 includes a first transistor M1, a second transistor M2, a third transistor M3 and a first capacitor C1. The first transistor M1 has a control terminal electrically connected to the second clock signal terminal XCK, a first terminal electrically connected to the low level signal terminal VGL, and a second terminal electrically connected to the third node N3. The second transistor M2 has a control terminal electrically connected to the third node N3, a first terminal electrically connected to the first clock signal terminal CK, and a second terminal electrically connected to the fourth node N4. The third transistor M3 has a control terminal electrically connected to the first clock signal terminal CK, a first terminal electrically connected to the fourth node N4, and a second terminal electrically connected to the second node N2. The first capacitor C1 has a first terminal electrically connected to the third node N3 and a second terminal electrically connected to the fourth node N4.

The first transistor M1 is configured to provide the low level signal to the third node N3 when it is switched on in response to the second clock signal. The second transistor M2 is configured to provide the first clock signal to the fourth node N4 when it is switched on in response to the level at the third node N3. The third transistor M3 is configured to provide the level at the fourth node N4 to the second node N2 or to provide the level at the second node N2 to the fourth node N4 when it is switched on in response to the first clock signal. The first capacitor C1 is configured to maintain the level at the third node N3 and to pull down the level at the third node N3 when the level at the fourth node N4 changes from a high level to a low level.

According to the embodiment of the present disclosure, each of the first transistor M1, the second transistor M2 and the third transistor M3 can be a PMOS transistor, which is switched on when its control terminal is at a low level and switched off when the control terminal is at a high level. Unless otherwise specified, the transistors mentioned in following embodiments of the present disclosure are all PMOS transistors.

According to an embodiment of the present disclosure, the specific process of the second node control module 2 involving the above mentioned circuit structure writing the second node N2 to a low level is described as follows. As shown in FIG. 6, in the second phase P2, the first clock signal provided by the first clock signal terminal CK is at a high level, and the second clock signal provided by the second clock signal terminal XCK is at a low level. The first transistor M1 controlled by the second clock signal is switched on. The low level signal arrives at the third node N3 through the first transistor M1, and then the third node N3 is at a low level. The second transistor M2 is switched on. The first clock signal arrives at the fourth node N4 through the second transistor M2, and the fourth node N4 is then at a high level. The third transistor M3 controlled by the first clock signal is switched off. In the third phase P3, the first clock signal provided by the first clock signal terminal CK is at a low level, and the second clock signal provided by the second clock signal terminal XCK is at a high level. The first transistor M1 controlled by the second clock signal is switched off. The first capacitor C1 maintains the third node N3 at the low level of the second phase P2. The second transistor M2 is switched on. The first clock signal arrives at the fourth node N4 through the second transistor M2. The level at the fourth node N4 changes from the high level of the second phase P2 to a low level. Due to a coupling effect of the first capacitor C1, the low level at the third node N3 is pulled down. The third transistor M3 controlled by the first clock signal is switched on. The low level at the fourth node N4 arrives at the second node N2 through the third transistor M3. The second node N2 is then at a low level.

Since the low level at the third node N3 is pulled down under the coupling effect of the first capacitor C1 in the third phase P3, the low level at the third node N3 can become lower, so that the second transistor M2 can be switched on more thoroughly and the low level of the first clock signal can completely arrive at the fourth node N4. In this way, the low level at the fourth node N4 is much lower and thus the low level at the second node N2 is much lower when the low level at the fourth node N4 arrives the second node N2 through the third transistor M3. In this way, even if the level at the second node N2 rises due to shift of a threshold voltage of a transistor during use, there would not be such a case in which the level at the second node N2 cannot control the output control module 3, which is conductive to maintaining the normal output of the shift register.

In an implementation, as shown in FIGS. 3-5, the second node control module further includes a fourth transistor M4, a fifth transistor M5, and a second capacitor C2. The fourth transistor M4 has a control terminal electrically connected to the input signal terminal IN, a first terminal electrically connected to the third node N3, and a second terminal electrically connected to the fourth node N4. The fifth transistor M5 has a control terminal electrically connected to the input signal terminal IN, a first terminal electrically connected to the high level signal terminal VGH, and a second terminal electrically connected to the fourth node N2. The second capacitor C2 has a first terminal electrically connected to the high level signal terminal VGH and a second terminal electrically connected to the second node N2.

The fourth transistor M4 is used to provide the level at the third node N3 to the fourth node N4 or provide the level at the fourth node N4 to the third node N3 when it is switched on in response to the input signal. The fifth transistor M5 is used to provide the high level signal to the fourth node N4 when it is switched on in response to the input signal. The second capacitor C2 is used to maintain the level at the second node N2.

There are various kinds of specific circuit structures for the first node control module 1 according to the embodiments of the present disclosure, which will be illustrated as follow.

In a first example, as shown in FIG. 3, the first node control module 1 is further electrically connected to the first clock signal terminal CK. The first node control module 1 is configured to control writing of the input signal into the fifth node N5 based on the first clock signal, and to control writing of the level at the fifth node N5 into the first node N1 based on the first clock signal.

In an implementation, as shown in FIG. 3, the first node control module 1 includes a sixth transistor M6 and a seventh transistor M7. The sixth transistor M6 has a control terminal electrically connected to the first clock signal terminal CK, a first terminal electrically connected to the input signal terminal IN, and a second terminal electrically connected to the fifth node N5. The seventh transistor M7 has a control terminal electrically connected to the first clock signal terminal CK, a first terminal electrically connected to the fifth node N5, and a second terminal electrically connected to the first node N1.

The sixth transistor M6 is configured to provide the input signal to the fifth node N5 when it is switched on in response to the first clock signal. The seventh transistor M7 is configured to provide the level at the fifth node N5 to the first node N1 or provide the level at the first node N1 to the fifth node N5, when it is switched on in response to the first clock signal.

As mentioned above, all the transistors in the embodiments of the present disclosure can be PMOS transistors. When the seventh transistor M7 is a PMOS transistor, it has loss when transmitting a low level. Therefore, when the input signal is at a high level and the level at the first node N1 is low, after the low level at the first node N1 arrives at the fifth node N5 through the seventh transistor M7, the low level at the fifth node N5 will be higher (i.e., its absolute value will be smaller) than the low level at the first node N1. In this way, a voltage drop between the first terminal and the second terminal of the sixth transistor M6 can be reduced and the sixth transistor M6 is protected from being broken down. Provided that the seventh transistor M7 has a threshold voltage of −2V, the input signal is at a high level of 8.00000V, the low level at the first node N1 in the second phase, which is −19.53447V, arrives at the fifth node N5 through the seventh transistor M7, and then the low level at the fifth node N5 is −17.53447V. At this moment, a level at the first terminal of the sixth transistor M6 (i.e., the level of the input signal) is 8.00000V, a level at the second terminal (i.e., the low level at the fifth node N5) is −17.53447V, and the voltage drop between the first terminal and the second terminal of the sixth transistor M6 is 25.53447V. The voltage drop should be 27.53447V without the seventh transistor M7.

In a second example, as shown in FIG. 4, the first node control module 1 is further electrically connected to the first clock signal terminal CK. The first node control module 1 is further configured to control writing of the input signal into the fifth node N5 based on the first clock signal, and to control writing of a level at the fifth node N5 into the first node N1 based on the first clock signal and the second clock signal.

In an implementation, as shown in FIG. 4, the first node control module 1 includes a sixth transistor M6, a seventh transistor M7 and an eighth transistor M8. The sixth transistor M6 has a control terminal electrically connected to the first clock signal terminal CK, a first terminal electrically connected to the input signal terminal IN, and a second terminal electrically connected to the fifth node N5. The seventh transistor M7 has a control terminal electrically connected to the first clock signal terminal CK, a first terminal electrically connected to the fifth node N5, and a second terminal electrically connected to the first node N1. The eighth transistor M8 has a control terminal electrically connected to the second clock signal terminal XCK, a first terminal electrically connected to the fifth node N5, and a second terminal electrically connected to the first node N1.

The sixth transistor M6 is configured to provide the input signal to the fifth node N5 when it is switched on in response to the first clock signal. The seventh transistor M7 is configured to provide the level at the fifth node N5 to the first node N1 or provide the level at the first node N1 to the fifth node N5, when it is switched on in response to the first clock signal. The eighth transistor M8 is configured to provide the level at the fifth node N5 to the first node N1 or provide the level at the first node N1 to the fifth node N5 when it is switched on in response to the second clock signal.

Similarly, the seventh transistor M7 and the eighth transistor M8 are both PMOS transistors, one of which is controlled by the first clock signal and the other one of which is controlled by the second clock signal. There is no overlapping between low levels of the first and second clock signals, and there is no overlapping between high levels of the first and second clock signals. Therefore, as long as one switched-on PMOS transistor is disposed between the first node N1 and the fifth node N5, the voltage drop between the first terminal and the second terminal of the sixth transistor M6 can be reduced, which can protect the sixth transistor M6 from being broken down.

In a third example, the first node control module 1 is further electrically connected to the low level signal terminal VGL, the second node N2 and the high level signal terminal VGH, and is further configured to control writing of the low level signal into the first node N1 based on the input signal and to control writing of the high level signal into the first node N1 based on the level at the second node N2.

In an implementation, the first node control module 1 includes a ninth transistor M9 and a tenth transistor M10. The ninth transistor M9 has a control terminal electrically connected to the input signal terminal IN, a first terminal electrically connected to the low level signal terminal VGL, and a second terminal electrically connected to the first node N1. The tenth transistor M10 has a control terminal electrically connected to the second node N2, a first terminal electrically connected to the high level signal terminal VGH, and a second terminal electrically connected to the first node N1.

The ninth transistor M9 is configured to provide the low level signal to the first node N1 when it is switched on in response to the input signal, and the tenth transistor M10 is sued to provide the high level signal to the first node N1 when it is switched on in response to the level at the second node N2.

At this time, a voltage drop between the first terminal and the second terminal of the ninth transistor M9 is a difference value between the level at the first node N1 and the low level of the low level signal. Since the low level of the low level signal is constant, even if the level at the first node N1 is very low, the difference value will not be too large to break the ninth transistor M9. Provided that the low level of the low level signal is −7.00000V, when the low level at the first node N1 is as low as −19.53447V, a level at the first terminal of the ninth transistor M9 (i.e., the low level of the low level signal) is −7.00000V, a level at the second terminal (i.e., the low level at the first node N1) is −19.53447V, and the voltage drop between the first terminal and the second terminal of the ninth transistor M9 is only 12.53447V.

In an implementation, as shown in FIGS. 3-5, the first node control module 1 further includes a third capacitor C3. The third capacitor C3 has a first terminal electrically connected to the output terminal OUT and a second terminal electrically connected to the first node N1. In this way, when the output terminal OUT outputs a low level of the second phase P2, the low level at the first node N1 will be lower under the coupling effect of the third capacitor C3, so that the output control module 3 can be more effectively controlled, thereby leading to a better output effect for the shift register.

As shown in FIGS. 3-5, the output control module 3 includes an eleventh transistor M11 and a twelfth transistor M12. The eleventh transistor M11 has a control terminal electrically connected to the second node N2, a first terminal electrically connected to the high level signal terminal VGH, and a second terminal electrically connected to the output terminal OUT. The twelfth transistor M12 has a control terminal electrically connected to the first node N1, a first terminal electrically connected to the second clock signal terminal XCK, and a second terminal electrically connected to the output terminal OUT.

The eleventh transistor M11 is configured to provide the high level signal to the output terminal OUT when it is switched on in response to the level at the second node N2. The twelfth transistor M12 is configured to provide the second clock signal to the output terminal OUT when it is switched on in response to the level at the first node N1.

For example, the first capacitor C1 and the second capacitor C2 both have a capacitance of 100 F, the third capacitor C3 has a capacitance of 150 F, and the first transistor M1 to the twelfth transistor M12 all have a channel with a width to length ratio of 8:4.

In the following, by taking a shift register having a circuit structure shown in FIG. 3 as an example, specific operating states of respective transistors and capacitors in respective phases of the shift register will be explained in detail with reference to an operating sequence diagram of the shift register as shown in FIG. 6.

In the first phase P1, the input signal provided by the input signal terminal IN is at a low level, the first clock signal provided by the first clock signal terminal CK is at a low level, and the second clock signal provided by the second clock signal terminal XCK is at a high level. The fourth transistor M4 and the fifth transistor M5 under control of the input signal are both switched on. The high level signal arrives at the third node N3 through the fourth transistor M4 and the fifth transistor M5. The third node N3 is then at a high level. The second transistor M2 is switched off. The high level signal arrives at the fourth node N4 through the fifth transistor M5. The fourth node N4 is then at a high level. The third transistor M3, the sixth transistor M6 and the seventh transistor M7 under control of the first clock signal are all switched on. The high level at the fourth node N4 arrives at the second node N2 through the third transistor M3. The second node N2 is then at a high level. The input signal arrives at the fifth node N5 through the sixth transistor M6. The fifth node N5 is then at a low level. The low level at the fifth node N5 arrives at the first node N1 through the seventh transistor M7. The first node N1 is then at a low level. The first transistor M1 under control of the second clock signal is switched off. The low level at the first node N1 switches the twelfth transistor M12 on. The high level at the second node N2 switches the eleventh transistor M11 off. The second clock signal arrives at the output terminal OUT through the twelfth transistor M12. The output terminal OUT then output a high level.

In the second phase P2, the input signal provided by the input signal terminal IN is at a high level, the first clock signal provided by the first clock signal terminal CK is at a high level, and the second clock signal provided by the second clock signal terminal XCK is at a low level. The fourth transistor M4 and the fifth transistor M5 under control of the input signal are both switched off. The third transistor M3, the sixth transistor M6 and the seventh transistor M7 under control of the first clock signal are all switched off. The third capacitor C3 maintains the first node N1 at the low level of the first phase P1. The second capacitor C2 maintains the second node N2 at the high level of the first phase P1. The fifth node N5 is suspended. The first transistor M1 under control of the second clock signal is switched on. The low level signal arrives at the third node N3 through the first transistor M1. The third node N3 is then at a low level. The second transistor M2 is switched on. The first clock signal arrives at the fourth node N4 through the second transistor M2. The fourth node N4 is then at a high level. The low level at the first node N1 switches the twelfth transistor M12 on. The high level at the second node N2 switches the eleventh transistor M11 off. The second clock signal arrives at the output terminal OUT through the twelfth transistor M12. The output terminal OUT outputs a low level. The level at the first node N1 becomes lower under the coupling of the third capacitor C3.

In the third phase P3, the input signal provided by the input signal terminal IN is at a high level, the first clock signal provided by the first clock signal terminal CK is at a low level, and the second clock signal provided by the second clock signal terminal XCK is at a high level. The fourth transistor M4 and the fifth transistor M5 under control of the input signal are both switched off. The first transistor M1 under control of the second clock signal is switched off. The first capacitor C1 maintains the third node N3 at the low level of the second phase P2. The second transistor M2 is switched on. The first clock signal arrives at the fourth node N4 through the second transistor M2. The fourth node N4 changes from the high level of the second phase P2 to a low level. The low level at the third node N3 becomes lower due to the coupling effect of the first capacitor C1. The third transistor M3, the sixth transistor M6 and the seventh transistor M7 under control of the first clock signal are all switched on. The low level at the fourth node N4 arrives at the second node N2 through the third transistor M3. The second node N2 is then at a low level. The input signal arrives at the fifth node N5 through the sixth transistor M6. The fifth node N5 is then at a high level. The high level at the fifth node N5 arrives at the first node N1 through the seventh transistor M7. The first node N1 is then at a high level. The high level at the first node N1 switches the twelfth transistor M12 off. The low level at the second node N2 switches the eleventh transistor M11 on. The high level signal arrives at the output terminal OUT through the eleventh transistor M11. The output terminal OUT then output a high level.

In the fourth phase P4, the input signal provided by the input signal terminal IN is at a high level, the first clock signal provided by the first clock signal terminal CK is at a high level, and the second clock signal provided by the second clock signal terminal XCK is at a low level. The fourth transistor M4 and the fifth transistor M5 under control of the input signal are both switched off. The third transistor M3, the sixth transistor M6 and the seventh transistor M7 under control of the first clock signal are all switched off. The third capacitor C3 maintains the first node N1 at the high level of the third phase P3. The second capacitor C2 maintains the second node N2 at the low level of the third phase P3. The fifth node N5 is suspended. The first transistor M1 under control of the second clock signal is switched on. The low level signal arrives at the third node N3 through the first transistor M1. The third node N3 is then at a low level. The second transistor M2 is switched on. The first clock signal arrives at the fourth node N4 through the second transistor M2. The fourth node N4 is then at a high level. The high level at the first node N1 switches the twelfth transistor M12 off. The low level at the second node N2 switches the eleventh transistor M11 off. The high level signal arrives at the output terminal OUT through the eleventh transistor M11. The output terminal OUT outputs a high level.

It should be noted that for any shift register involving the circuit structures as shown in FIGS. 4 and 5, those skilled in the art will know the specific operating states of respective transistors and capacitors in respective phases of the shift register without paying any inventive labor, which will not be described again.

Figure 7:
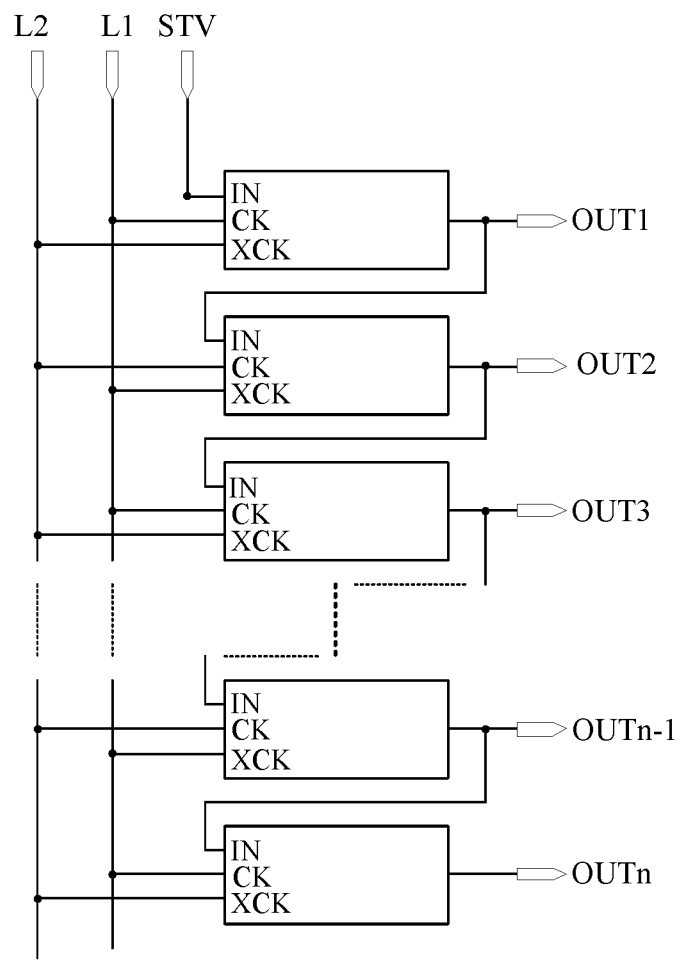
FIG. 7 is a structural schematic diagram of a scan driving circuit according to an embodiment of the present disclosure.
Figure 8:
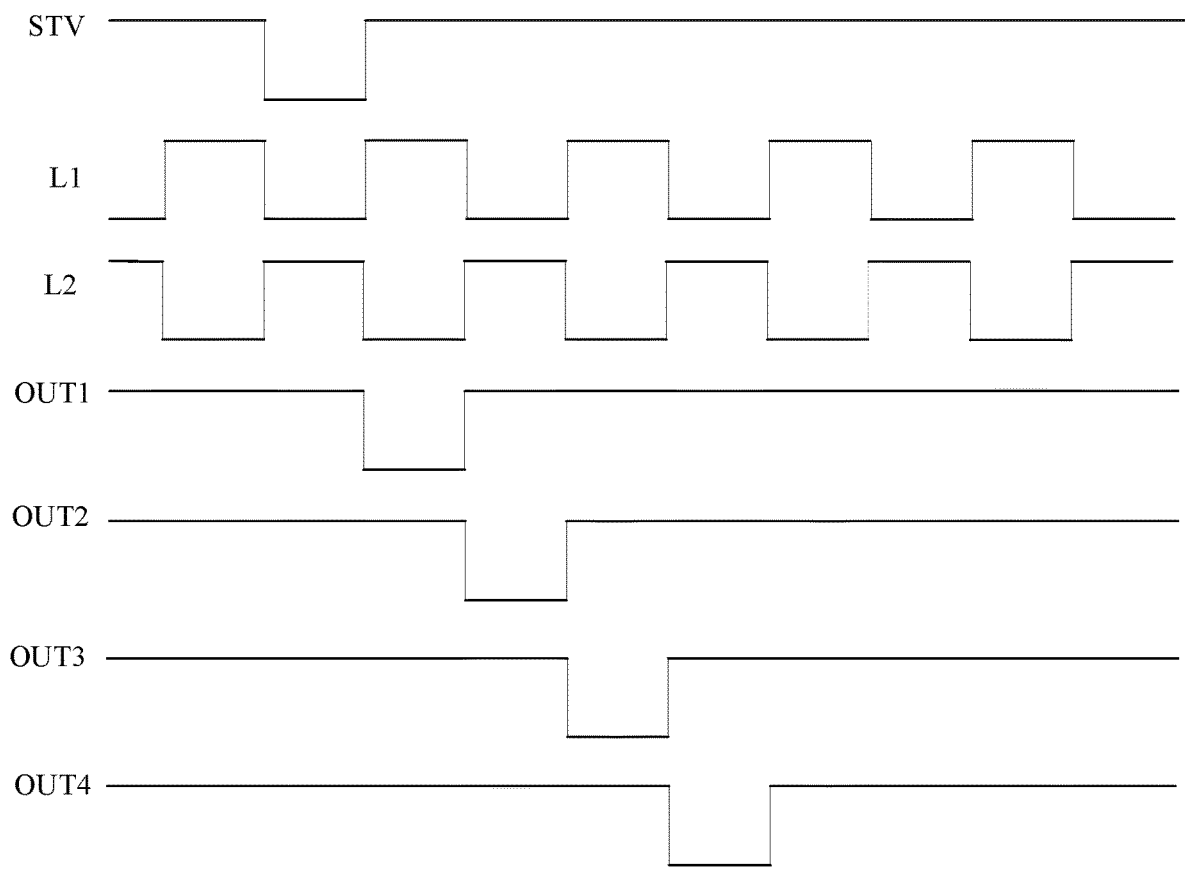
FIG. 8 is an operating sequence diagram of a scan driving circuit according to the embodiment of the present disclosure.

The embodiments of the present disclosure further provide a scan driving circuit, as shown in FIGS. 7 and 8. FIG. 7 is a structural schematic diagram of a scan driving circuit according to an embodiment of the present disclosure, and FIG. 8 is an operating sequence diagram of a scan driving circuit according to the embodiment of the present disclosure. The scan driving circuit includes a first signal line L1, a second signal line L2, and a plurality of cascaded shift registers. A shift register at each stage can be any shift register mentioned above.

The first clock signal terminal CK of a shift register at each odd-numbered stage and the second clock signal terminal XCK of a shift register at each even-numbered stage are both electrically connected to the first signal line L1.

The second clock signal terminal XCK of a shift register at each odd-numbered stage and the first clock signal terminal CK of a shift register at each even-numbered stage are both electrically connected to the second signal line L2.

In an implementation, as shown in FIG. 7, the input signal terminal IN of a shift register at an $n^{th}$ stage of the plurality of cascaded shift registers is electrically connected to the scan signal output terminal OUTn−1 of a shift register at an $(n-1)^{th}$ stage of the plurality of cascaded shift registers, where n is 2, 3, 4, . . . , N, and N is a number of the plurality of cascaded shift registers in the scan driving circuit.

There are various connection manners for the input signal terminal IN of the shift register at the first stage.

In a first manner, as shown in FIG. 7, the scan driving circuit can further include an input signal line STV, and the input signal terminal IN of the shift register at a $1^{st}$ stage is electrically connected to the input signal line STV. In a second manner, the scan driving circuit can further include a front-loading scan unit, which has a same structure with the shift register. The front-loading scan unit has a scan signal output terminal electrically connected to the input signal terminal IN of the shift register at the first stage. In a third manner, the input signal terminal IN of the shift register at the $1^{st}$ stage is electrically connected to the output terminal OUT of the shift register at the $N^{th}$ stage. As shown in FIG. 7, when the input signal terminal IN of the shift register at the $1^{st}$ stage is electrically connected to the input signal line STV, the scan driving circuit can have a relatively simple circuit structure and its driving method is also relatively simple.

Figure 9:
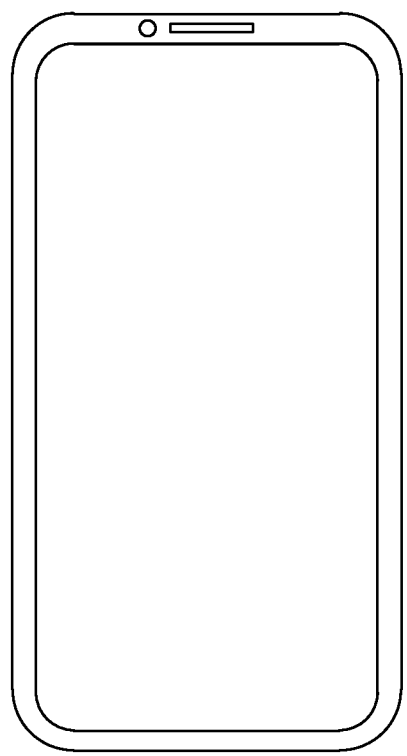
FIG. 9 is a structural schematic diagram of a display device according to an embodiment of the present disclosure.

In addition, the embodiments of the present disclosure further provide a display device as shown in FIG. 9. FIG. 9 is a structural schematic diagram of a display device according to an embodiment of the present disclosure. The display device includes the scan driving circuit as mentioned above. The display device according to the embodiments of the present disclosure can be any product or device having display function such as a smart phone, a wearable smart watch, intelligent glasses, a Tablet PC, a TV, a monitor, a laptop, a digital photo frame, a navigator, a car monitor, an e-book, and the like. The display panel and the display device provided in the embodiments of the present disclosure can be either flexible or non-flexible, which is not limited herein.

In an implementation, the display device can be an organic light-emitting display device, which can include an organic light-emitting display panel. The organic light-emitting display panel includes a plurality of pixel circuits and a plurality of Organic Light-Emitting Diodes (OLEDs). Each organic light-emitting diode has an anode electrically connected to a corresponding pixel circuit. The plurality of light-emitting diodes includes a light-emitting diode for emitting red light, a light-emitting diode for emitting green light, and a light-emitting diode for emitting blue light. In addition, the organic light-emitting display panel further includes an encapsulation layer for covering the plurality of organic light-emitting diodes.

The embodiments of the present disclosure provide a shift register, a driving method of the shift register, a scan driving circuit, and a display device. The shift register includes a first node control module, a second node control module and an output control module. The first node control module is configured to control a level at the first node based on the input signal and the second clock signal. The second node control module is configured to control a level at the second node based on the input signal, the first clock signal, the second clock signal, the low level signal and the high level signal. The output control module is configured to control the output terminal to output a high level or a low level based on the level at the first node, the level at the second node and the second clock signal. The level at the third node controls the writing of the first clock signal into the fourth node. The first clock signal controls writing of the level at the fourth node into the second node, and when the level at the fourth node changes to a low level, the level at the third node is pulled down. In this way, comparing with prior art, the low level at the third node in the third phase can be much lower, the low level of the first clock signal can be completely written into the fourth node N4, so that the low level at the fourth node can be lower. In addition, when the low level at the fourth node is written into the second node, the level at the second node can be lower. Therefore, the shift register according to the embodiment of the present disclosure can provide a lower level to the second node, and avoid that the level at the second node could not control the output control module, thereby facilitating the normal output of the shift register.

Finally, it should be noted that, the above-described embodiments are merely intended to illustrate the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A scan driving circuit, comprising a plurality of cascaded shift registers, wherein at each stage of the plurality of cascaded shift registers, a shift register comprises:
   a first node control module electrically connected to an input signal terminal, a second clock signal terminal and a first node, and configured to control a level at the first node based on an input signal and a second clock signal;
   a second node control module electrically connected to the input signal terminal, a first clock signal terminal, the second clock signal terminal, a low level signal terminal, a high level signal terminal and a second node, and configured to control a level at the second node based on the input signal, a first clock signal, the second clock signal, a low level signal and a high level signal, wherein a level at a third node controls writing of the first clock signal into a fourth node, the first clock signal controls writing of a level at the fourth node into the second node, and pulls down the level at the third node when the level at the fourth node changes to a low level; a low level of the first clock signal is completely written into the fourth node to allow the level at the fourth node to be lower; the low level at the fourth node is written into the second node to allow the level at the second node to be lower; and
   an output control module electrically connected to the first node, the second node, the high level signal terminal, the second clock signal terminal and an output terminal, and configured to control the output terminal to output a high level or a low level based on the level at the first node, the level at the second node and the second clock signal,
   wherein the second node control module comprises:
   a first transistor having a control terminal electrically connected to the second clock signal terminal, a first terminal electrically connected to the low level signal terminal, and a second terminal electrically connected to the third node;
   a second transistor having a control terminal electrically connected to the third node, a first terminal electrically connected to the first clock signal terminal, and a second terminal electrically connected to the fourth node;
   a third transistor having a control terminal electrically connected to the first clock signal terminal, a first terminal electrically connected to the fourth node, and a second terminal electrically connected to the second node; and
   a first capacitor having a first terminal electrically connected to the third node and a second terminal electrically connected to the fourth node.

2. The scan driving circuit according to claim 1, wherein the second node control module further comprises:
   a fourth transistor having a control terminal electrically connected to the input signal terminal, a first terminal electrically connected to the third node, and a second terminal electrically connected to the fourth node;
   a fifth transistor having a control terminal electrically connected to the input signal terminal, a first terminal electrically connected to the high level signal terminal, and a second terminal electrically connected to the fourth node; and
   a second capacitor having a first terminal electrically connected to the high level signal terminal and a second terminal electrically connected to the second node.

3. The scan driving circuit according to claim 1, wherein the first node control module is also electrically connected to the first clock signal terminal, and the first node control module is further configured to control writing of the input signal into a fifth node based on the first clock signal and to control writing of a level at the fifth node into the first node based on the first clock signal.

4. The scan driving circuit according to claim 3, wherein the first node control module comprises:

a sixth transistor having a control terminal electrically connected to the first clock signal terminal, a first terminal electrically connected to the input signal terminal, and a second terminal electrically connected to the fifth node; and a seventh transistor having a control terminal electrically connected to the first clock signal terminal, a first terminal electrically connected to the fifth node, and a second terminal electrically connected to the first node.

5. The scan driving circuit according to claim 3, wherein the first node control module further comprises a third capacitor, and the a third capacitor has a first terminal electrically connected to the output terminal and a second terminal electrically connected to the first node.

6. The scan driving circuit according to claim 1, wherein the first node control module is further electrically connected to the first clock signal terminal, and the first node control module is further configured to control writing of the input signal into a fifth node based on the first clock signal and to control writing of a level at the fifth node into the first node based on the first clock signal and the second clock signal.

7. The scan driving circuit according to claim 6, wherein the first node control module comprises:
   a sixth transistor having a control terminal electrically connected to the first clock signal terminal, a first terminal electrically connected to the input signal terminal, and a second terminal electrically connected to the fifth node;
   a seventh transistor having a control terminal electrically connected to the first clock signal terminal, a first terminal electrically connected to the fifth node, and a second terminal electrically connected to the first node; and
   an eighth transistor having a control terminal electrically connected to the second clock signal terminal, a first terminal electrically connected to the fifth node, and a second terminal electrically connected to the first node.

8. The scan driving circuit according to claim 6, wherein the first node control module further comprises a third capacitor, and the a third capacitor has a first terminal electrically connected to the output terminal and a second terminal electrically connected to the first node.

9. The scan driving circuit according to claim 1, wherein the first node control module is further electrically connected to the low level signal terminal, the second node and the high level signal terminal, and the first node control module is further configured to control writing of the low level signal into the first node based on the input signal and to control writing of the high level signal into the first node based on the level at the second node.

10. The scan driving circuit according to claim 9, wherein the first node control module comprises:
    a ninth transistor having a control terminal electrically connected to the input signal terminal, a first terminal electrically connected to the low level signal terminal, and a second terminal electrically connected to the first node; and
    a tenth transistor having a control terminal electrically connected to the second node, a first terminal electrically connected to the high level signal terminal, and a second terminal electrically connected to the first node.

11. The scan driving circuit according to claim 9, wherein the first node control module further comprises a third capacitor, and the a third capacitor has a first terminal electrically connected to the output terminal and a second terminal electrically connected to the first node.

12. The scan driving circuit according to claim 1, wherein the output control module comprises:
    an eleventh transistor having a control terminal electrically connected to the second node, a first terminal electrically connected to the high level signal terminal, and a second terminal electrically connected to the output terminal; and
    a twelfth transistor having a control terminal electrically connected to the first node, a first terminal electrically connected to the second clock signal terminal, and a second terminal electrically connected to the output terminal.

13. The scan driving circuit according to claim 1, further comprising a first signal line and a second signal line,
    wherein the first clock signal terminal of a shift register at each odd-numbered stage of the plurality of cascaded shift registers and the second clock signal terminal of a shift register at each even-numbered stage of the plurality of cascaded shift registers are both electrically connected to the first signal line, and
    the second clock signal terminal of the shift register at each odd-numbered stage of the plurality of cascaded shift registers and the first clock signal terminal of the shift register at each even-numbered stage of the plurality of cascaded shift registers are both electrically connected to the second signal line.

14. The scan driving circuit according to claim 13, wherein the input signal terminal of a shift register at an $n^{th}$ stage of the plurality of cascaded shift registers is electrically connected to a scan signal output terminal of a shift register at an $(n-1)^{th}$ stage of the plurality of cascaded shift registers, wherein n is 2, 3, 4, . . . , or N, and N is a number of the plurality of cascaded shift registers in the scan driving circuit.

15. A display device, comprising a scan driving circuit, the scan driving circuit comprising a plurality of cascaded shift registers, wherein at each stage of the plurality of cascaded shift registers, a shift register comprises:
    a first node control module electrically connected to an input signal terminal, a second clock signal terminal and a first node, and configured to control a level at the first node based on an input signal and a second clock signal;
    a second node control module electrically connected to the input signal terminal, a first clock signal terminal, the second clock signal terminal, a low level signal terminal, a high level signal terminal and a second node, and configured to control a level at the second node based on the input signal, a first clock signal, the second clock signal, a low level signal and a high level signal, wherein a level at a third node controls writing of the first clock signal into a fourth node, the first clock signal controls writing of a level at the fourth node into the second node, and pulls down the level at the third node when the level at the fourth node changes to a low level; a low level of the first clock signal is completely written into the fourth node to allow the level at the fourth node to be lower; the low level at the fourth node is written into the second node to allow the level at the second node to be lower; and
    an output control module electrically connected to the first node, the second node, the high level signal terminal, the second clock signal terminal and an output terminal, and configured to control the output terminal to output a high level or a low level based on the level at the first node, the level at the second node and the second clock signal, wherein the second node control module comprises:
a first transistor having a control terminal electrically connected to the second clock signal terminal, a first terminal electrically connected to the low level signal terminal, and a second terminal electrically connected to the third node;
a second transistor having a control terminal electrically connected to the third node, a first terminal electrically connected to the first clock signal terminal, and a second terminal electrically connected to the fourth node;
a third transistor having a control terminal electrically connected to the first clock signal terminal, a first terminal electrically connected to the fourth node, and a second terminal electrically connected to the second node; and
a first capacitor having a first terminal electrically connected to the third node and a second terminal electrically connected to the fourth node.

16. A driving method of a shift register, applicable in a shift register of a scan driving circuit comprising a plurality of cascaded shift registers, wherein at each stage of the plurality of cascaded shift registers, a shift register comprises:
a first node control module electrically connected to an input signal terminal, a second clock signal terminal and a first node, and configured to control a level at the first node based on an input signal and a second clock signal;
a second node control module electrically connected to the input signal terminal, a first clock signal terminal, the second clock signal terminal, a low level signal terminal, a high level signal terminal and a second node, and configured to control a level at the second node based on the input signal, a first clock signal, the second clock signal, a low level signal and a high level signal, wherein a level at a third node controls writing of the first clock signal into a fourth node, the first clock signal controls writing of a level at the fourth node into the second node, and pulls down the level at the third node when the level at the fourth node changes to a low level; a low level of the first clock signal is completely written into the fourth node to allow the level at the fourth node to be lower; the low level at the fourth node is written into the second node to allow the level at the second node to be lower; and
an output control module electrically connected to the first node, the second node, the high level signal terminal, the second clock signal terminal and an output terminal, and configured to control the output terminal to output a high level or a low level based on the level at the first node, the level at the second node and the second clock signal,
wherein the second node control module comprises:
a first transistor having a control terminal electrically connected to the second clock signal terminal, a first terminal electrically connected to the low level signal terminal, and a second terminal electrically connected to the third node;
a second transistor having a control terminal electrically connected to the third node, a first terminal electrically connected to the first clock signal terminal, and a second terminal electrically connected to the fourth node;
a third transistor having a control terminal electrically connected to the first clock signal terminal, a first terminal electrically connected to the fourth node, and a second terminal electrically connected to the second node; and
a first capacitor having a first terminal electrically connected to the third node and a second terminal electrically connected to the fourth node, wherein the driving method comprises:
providing, by the first node control module, a low level at the first node; providing, by the second node control module, a high level at the second node, a high level at the third node and a high level at the fourth node; and controlling, by the output control module, the output terminal to output a high level, in a first phase when the input signal provided by the input signal terminal is at a low level, the first clock signal provided by the first clock signal terminal is at a low level, and the second clock signal provided by the second clock signal terminal is at a high level,
maintaining, by the first node control module, the first node at the low level of the first phase; maintaining, by the second node control module, the second node at the high level of the first phase; providing, by the second node control module, a low level at the third node and a high level at the fourth node; and controlling, by the output control module, the output terminal to output a low level, in a second phase when the input signal provided by the input signal terminal is at a high level, the first clock signal provided by the first clock signal terminal is at a high level, and the second clock signal provided by the second clock signal terminal is at a low level,
providing, by the first node control module, a high level at the first node; providing, by the second node control module, a low level at the second node and a low level at the fourth node; pulling down, by the second node control module, the low level of the second phase at the third node; and controlling, by the output control module, the output terminal to output a high level, in a third phase when the input signal provided by the input signal terminal is at a high level, the first clock signal provided by the first clock signal terminal is at a low level, and the second clock signal provided by the second clock signal terminal is at a high level, and
maintaining, by the first node control module, the first node at the high level of the third phase; maintaining, by the second node control module, the second node at the low level of the third phase; providing, by the second node control module, a low level at the third node and a high level at the fourth node; and controlling, by the output control module, the output terminal to output a high level, in a fourth phase when the input signal provided by the input signal terminal is at a high level, the first clock signal provided by the first clock signal terminal is at a high level, and the second clock signal provided by the second clock signal terminal is at a low level.

17. The driving method of a shift register according to claim 16, wherein the low level of the first clock signal and the low level of the second clock signal are both equal to the low level of the low level signal, and the high level of the first clock signal and the high level of the second clock signal are both equal to the high level of the high level signal.

* * * * *